United States Patent
Cheng et al.

(10) Patent No.: US 12,063,796 B2
(45) Date of Patent: Aug. 13, 2024

(54) MANUFACTURING METHOD OF RESISTIVE RANDOM ACCESS MEMORY DEVICE

(71) Applicant: Winbond Electronics Corp., Taichung (TW)

(72) Inventors: Chia-Wen Cheng, Taichung (TW); Ping-Kun Wang, Taichung (TW); Yi-Hsiu Chen, Taichung (TW); He-Hsuan Chao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 190 days.

(21) Appl. No.: 17/960,121

(22) Filed: Oct. 4, 2022

(65) Prior Publication Data
US 2023/0038604 A1    Feb. 9, 2023

Related U.S. Application Data

(62) Division of application No. 16/952,085, filed on Nov. 19, 2020, now Pat. No. 11,502,131.

(30) Foreign Application Priority Data

Nov. 25, 2019 (TW) .................................. 108142717

(51) Int. Cl.
| | |
|---|---|
| H01L 45/00 | (2006.01) |
| H10B 63/00 | (2023.01) |
| H10N 70/00 | (2023.01) |

(52) U.S. Cl.
CPC .............. *H10B 63/84* (2023.02); *H10B 63/30* (2023.02); *H10N 70/061* (2023.02); *H10N 70/841* (2023.02)

(58) Field of Classification Search
CPC .. H10N 70/061; H10N 70/826; H10N 70/841; H10B 63/80
See application file for complete search history.

(56) References Cited

U.S. PATENT DOCUMENTS 11,502,131 B2 * 11/2022 Cheng .................. G11C 13/003

* cited by examiner

*Primary Examiner* — Mark V Prenty
(74) *Attorney, Agent, or Firm* — JCIPRNET

(57) ABSTRACT

A manufacturing method is provided. The method includes steps below. Forming bottom electrodes. Blanketly forming a resistance switching layer on the bottom electrodes. Forming a first insulating material layer on the resistance switching layer. Patterning the first insulating material layer to form insulating patterns. Conformally forming a channel layer having a plurality of channel regions on the resistance switching layer and the insulating patterns, wherein the plurality of channel regions are located on the resistance switching layer and cover opposite sides of the insulating patterns. Forming a second electrode material layer on the channel layer. Patterning the second electrode material layer to form top electrodes, each of the top electrodes is located in corresponding to one of the insulating patterns and covers at least two of the plurality of channel regions.

20 Claims, 17 Drawing Sheets

MANUFACTURING METHOD OF RESISTIVE RANDOM ACCESS MEMORY DEVICE

CROSS-REFERENCE TO RELATED APPLICATION

This application is a divisional application of and claims the priority benefit of a prior application Ser. No. 16/952,085, filed on Nov. 19, 2020, now pending, which claims the priority benefit of claims the priority benefit of Taiwan application Ser. No. 108142717, filed on Nov. 25, 2019. The entirety of the above-mentioned patent application is hereby incorporated by reference herein and made a part of this specification.

BACKGROUND

Technical Field

The present disclosure relates to a memory device and a manufacturing method thereof, and particularly, to a resistive random access memory (RRAM) device and a manufacturing method thereof.

Description of Related Art

RRAM is a type of non-volatile memory, of which a conductive path is formed or cut off in a dielectric layer between top and bottom electrodes, so as to switch between a low resistance stat and a high resistance state, and to store data. RRAM has merits including low power requirement and high program speed, thus become a new generation memory for novel applications such as internet of things (IoT). However, RRAMs are susceptible to soft error during operation, thus have reliability issues. Although the soft errors could be corrected by methods including adjusting operation voltages, modifying pulse width of the applied voltage or so forth, these methods may require additional circuits or may cause delay in operation, thus could be obstacles to miniaturization of RRAM and improvement of RRAM's operation speed.

SUMMARY

Accordingly, a RRAM device with improved reliability and a manufacturing method of such RRAM device are provided. The RRAM device has multiple channel regions in each resistive memory cell.

In an aspect of the present disclosure, a RRAM device is provided. The RRAM device comprises: bottom electrodes; a resistance switching layer, blanketly covering the bottom electrodes; insulating patterns, disposed on the resistance switching layer and located in corresponding to locations of the bottom electrodes; a channel layer, conformally covering the resistance switching layer and the insulating patterns, wherein the channel layer has a plurality of channel regions, the plurality of channel regions are located on the resistance switching layer, and cover sidewalls of the insulating patterns; and top electrodes, respectively covering at least two of the plurality of channel regions and respectively located in corresponding to one of the insulating patterns, such that the at least two of the channel regions are located between one of the bottom electrodes and one of the top electrodes.

In another aspect of the present disclosure, a manufacturing method of a RRAM device is provided. The method comprises: forming bottom electrodes, wherein the bottom electrodes are arranged along a first direction and extending along a second direction; blanketly forming a resistance switching layer on the bottom electrodes; forming a first insulating material layer on the resistance switching layer; patterning the first insulating material layer to form insulating patterns, wherein each of the insulating patterns is overlapped with one of the bottom electrodes; conformally forming a channel layer on the resistance switching layer and the insulating patterns, wherein the channel layer has a plurality of channel regions, the plurality of channel regions are located on the resistance switching layer, and cover opposite sides of the insulating patterns; forming a second electrode material layer on the channel layer; and patterning the second electrode material layer to form laterally separated top electrodes, each of the top electrodes is located in corresponding to one of the insulating patterns and covers at least two of the plurality of channel regions, such that the at least two of the channel regions are located between one of the bottom electrodes and one of the top electrodes.

As above, the resistive memory cell according to embodiments of the present disclosure includes the insulating patterns and the channel layer covering these insulating patterns. Each resistive memory cell (i.e., one of the top electrodes, one of the bottom electrodes overlapped with this top electrode and components between these top electrode and bottom electrode) can have multiple channel regions covering sidewalls of one of the insulating patterns. In this way, if one of the channel regions of the resistive memory cell is failed as a result of soft errors, other channel region(s) of the resistive memory cell can still be functional. Accordingly, as compared to a resistive memory cell having a single channel region, the multi-channel resistive memory cell according to embodiments of the present disclosure may have an improved reliability. In addition, since the resistance switching layer according to embodiments of the present disclosure is blanketly disposed on the bottom electrodes, the resistance switching layer can be formed without a patterning process, thus damages on the resistance switching layer resulted from an etching step may be avoided, and the reliability of the RRAM device may be further improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
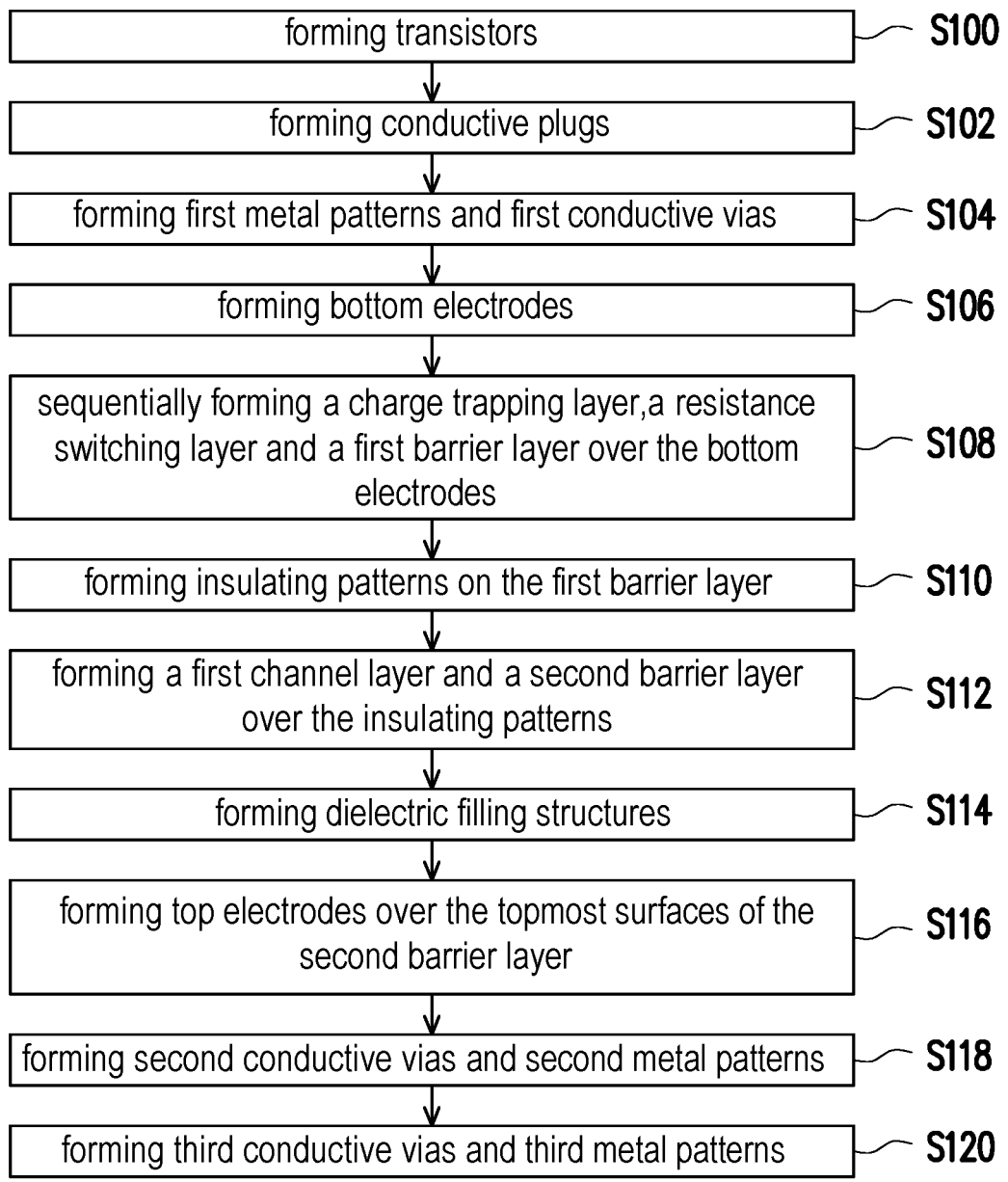
FIG. 1 is flow diagram illustrating a manufacturing method of a RRAM device according to some embodiments of the present disclosure.

FIG. 1 is flow diagram illustrating a manufacturing method of a RRAM device 10 according to some embodiments of the present disclosure. FIG. 2A through FIG. 2J are schematic three-dimensional views illustrating structures at various stages during the manufacturing process of the RRAM device 10 as shown in FIG. 1.

Figure 2A:
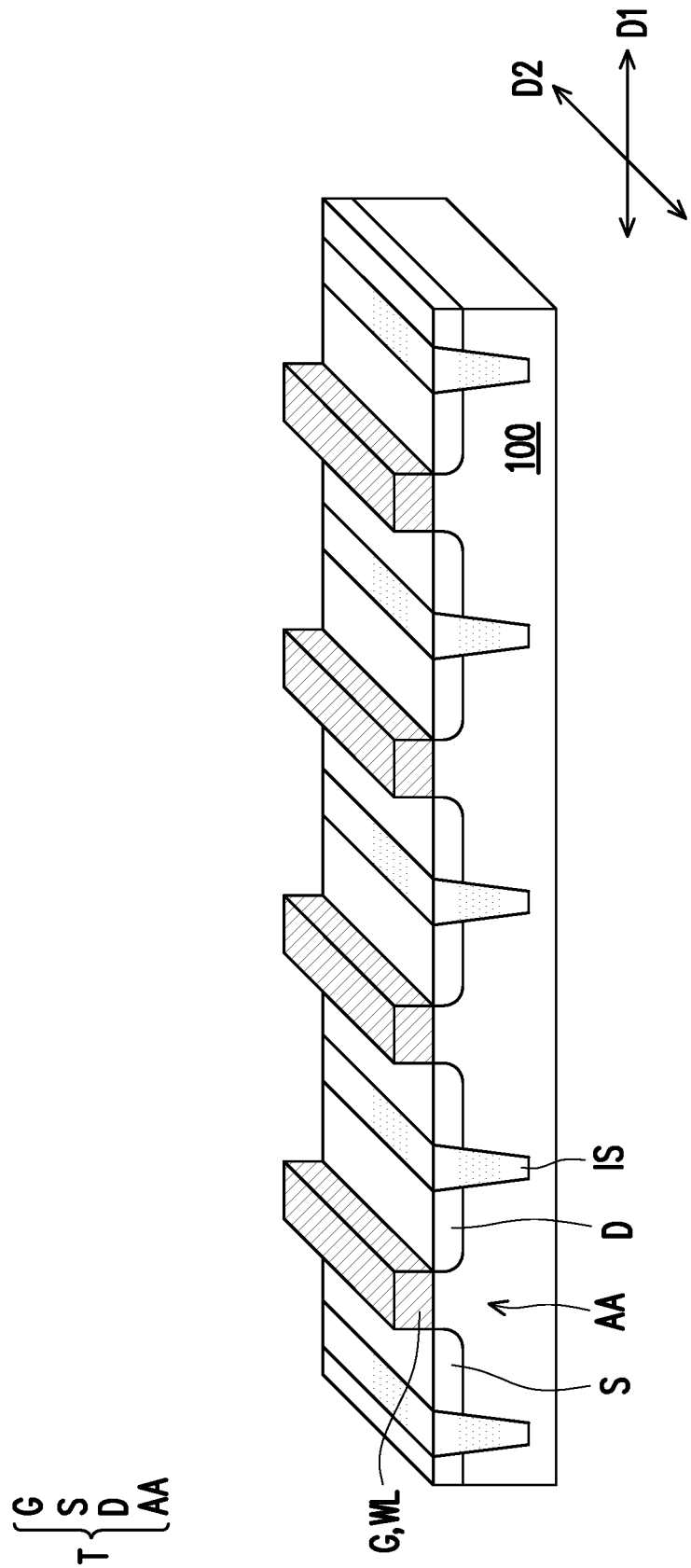
FIG. 2A through FIG. 2J are schematic three-dimensional views illustrating structures at various stages during the manufacturing process of the RRAM device as shown in FIG. 1.

Referring to FIG. 1 and FIG. 2A, step S100 is performed, and multiple transistors T are formed in and over a substrate 100. The substrate 100 may be a semiconductor substrate or a semiconductor-on-insulator (SOI) substrate. It should be noted that, merely one of the blocks of the subsequently formed RRAM device 10 (as shown in FIG. 2J) is exemplarily depicted in FIG. 2A. In some embodiments, each block includes transistors T arranged along a first direction D1 in a single row. Each transistor T may include an active area AA, a gate structure G, a drain electrode D and a source electrode S. In some embodiments, the active area AA is a doped region disposed in the substrate 100. In addition, an isolation structure IS may be disposed between adjacent active areas AA. For instance, the isolation structure IS may be a shallow trench isolation (STI). In some embodiments, the gate structure G is disposed on the substrate 100, and a gate dielectric layer (not shown) may be disposed between the gate structure G and the substrate 100. In addition, the gate structure G may extend along a second direction D2, and may be functioned as a word line WL. On the other hand, in some embodiments, the drain electrode D and the source electrode S are disposed in the substrate 100 and located at opposite sides of the gate structure G. In these embodiments, the drain electrode D and the source electrode S may be doped regions disposed in the substrate 100, and a conductive type of the drain electrode D and the source electrode S may be complementary to a conductive type of the active area AA. For instance, the conductive type of the active area AA may be P type, whereas the conductive type of the drain electrode D and the conductive type of the source electrode S may be N-type. Moreover, in some embodiments, the drain electrodes D of adjacent transistors T may be close to each other, whereas the source electrodes S of adjacent transistors T may be distant from each other. In alternative embodiments, the drain electrodes D and the sources electrodes S of the transistors T in the same row may alternately arranged along the first direction D1. The present disclosure is not limited to the arrangement of the drain electrodes D and the source electrodes S.

Figure 2B:
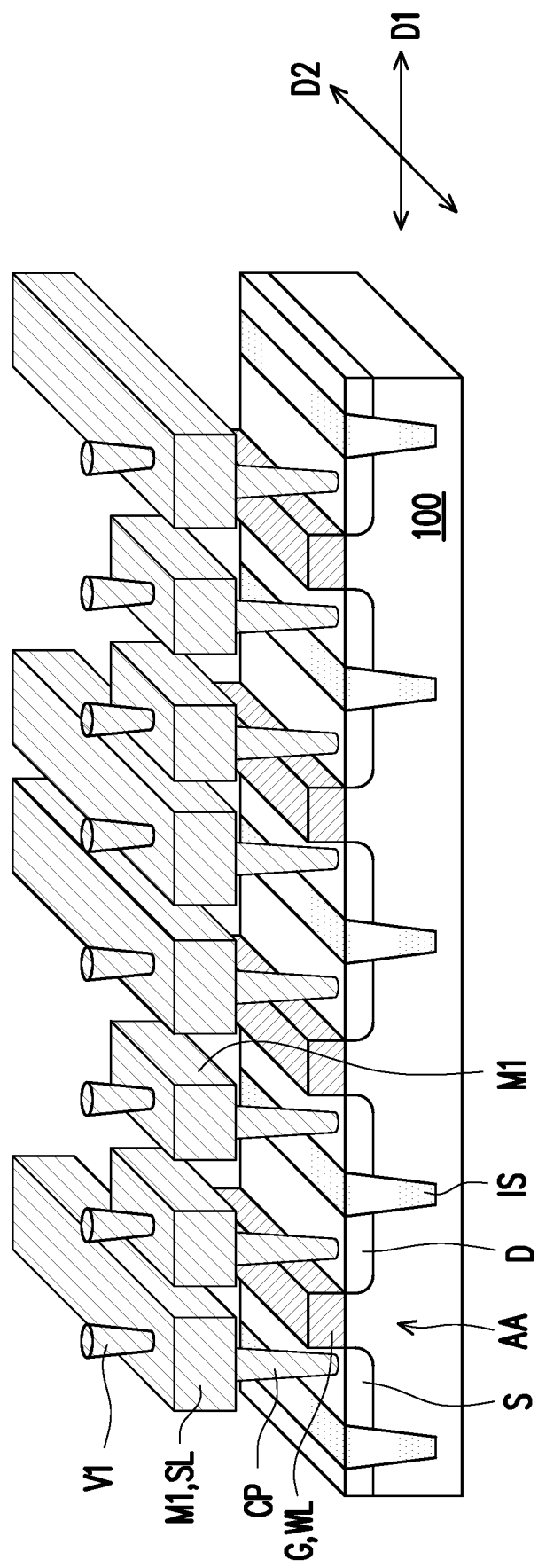

Referring to FIG. 1 and FIG. 2B, step S102 is performed, and multiple conductive plugs CP are formed on the substrate 100. A dielectric layer (not shown) may be formed on the substrate 100 by a deposition process (e.g., a chemical vapor deposition (CVD) process) before formation of the conductive plugs CP. This dielectric layer may be blanketly formed over the substrate 100, so as to cover the transistors T and the isolation structures IS. Subsequently, multiple through vias may be formed in this dielectric layer by, for example, an etching process, and a conductive material is filled in these through vias to form the conductive plugs CP. Each conductive plug CP penetrates through this dielectric layer, and is electrically connected to the drain electrode D or the source electrode S of the underlying transistor T.

Thereafter, step S104 is performed, and multiple first metal patterns M1 and multiple first conductive vias V1 are formed on the conductive plugs CP. A first interlayer dielectric layer (not shown) may be formed on the substrate 100 before formation of the first metal patterns M1. Subsequently, the first metal patterns M1 may be formed in the first interlayer dielectric layer by a damascene process. Each first metal pattern M1 is disposed on one of the conductive plugs CP, and is electrically connected to this conductive plug CP. In some embodiments, some of the first metal patterns M1 are electrically connected to the source electrodes S of the transistors T through the conductive plugs CP. These first metal patterns M1 may extend along the second direction D2, and may be functioned as source lines SL. Once the first metal patterns M1 have been formed, a second interlayer dielectric layer (not shown) may be formed on the first interlayer dielectric layer, and the first conductive vias V1 may be formed in the second interlayer dielectric layer by a damascene process. Each first conductive via V1 penetrates through the second interlayer dielectric layer, and is electrically connected to the underlying first metal pattern M1.

Figure 2C:
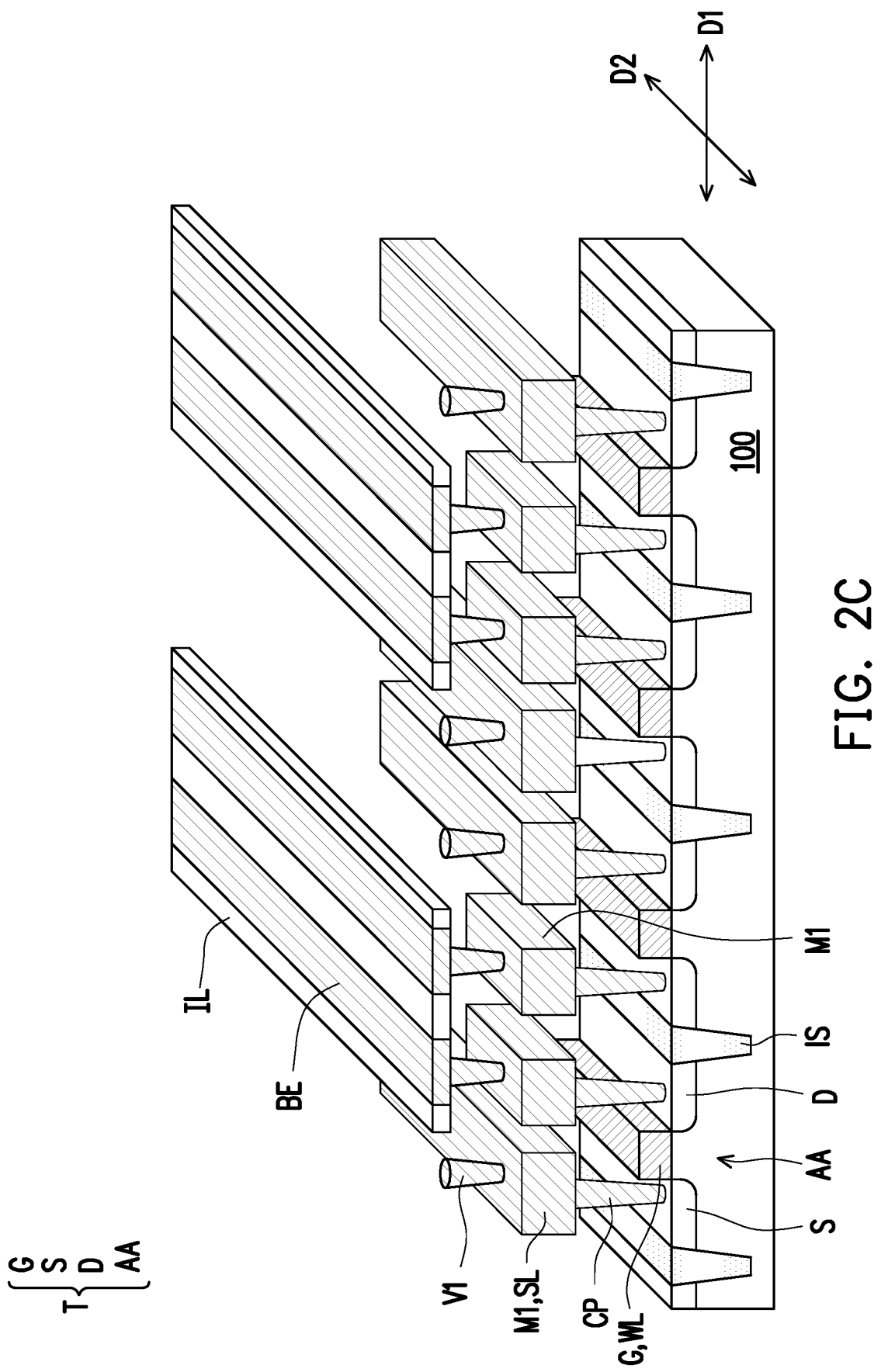

Referring to FIG. 1 and FIG. 2C, step S106 is performed, and multiple bottom electrodes BE are formed. In some embodiments, a method for forming the bottom electrodes BE includes blanketly forming an electrode material layer on the second interlayer dielectric layer (not shown) by a deposition process (e.g., a physical vapor deposition (PVD) process). Thereafter, the electrode material layer is patterned to form the bottom electrodes BE. Each of the bottom electrodes BE is electrically connected to the drain electrode D of one of the transistors T through the underlying first conductive via V1, first metal pattern M1 and conductive plug CP. In some embodiments, the bottom electrodes BE are arranged along the first direction D1, and respectively extend along the second direction D2. In this way, the subsequently formed resistive memory cells MU (as shown in FIG. 2H) arranged along the second direction D2 in the same column may share the same bottom electrode BE. A material of the bottom electrodes BE may include Ti, TiN, W, Pt, Al or the like.

In some embodiments, multiple dielectric filling structures IL may be formed after formation of the bottom electrodes BE. The dielectric filling structures IL are respectively filled in between adjacent bottom electrodes BE. In some other embodiments, separated dielectric filling structures IL are formed before formation of the bottom electrodes BE, then the bottom electrodes BE are disposed in between adjacent dielectric filling structures IL. Top surfaces of the dielectric filling structures IL may be coplanar with top surfaces of the bottom electrodes BE. For instance, a chemical mechanical polishing (CMP) process, an etching process or a combination thereof may be used to render the top surfaces of the dielectric filling structures IL and the bottom electrodes BE coplanar with one another. It should be noted that, for conciseness, only some of the dielectric filling structures IL are depicted in FIG. 2C through FIG. 2J.

Figure 2D:
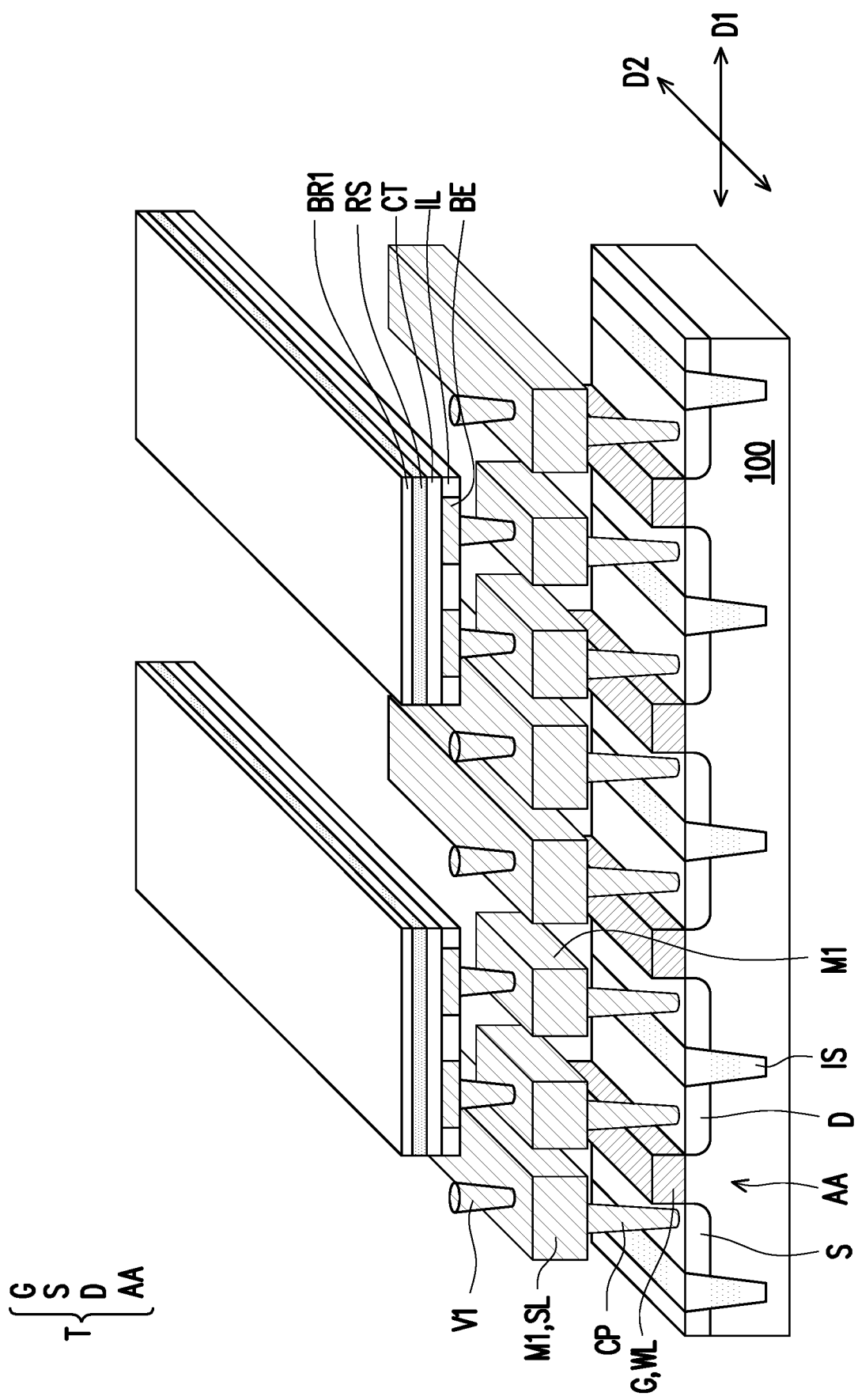

Referring to FIG. 1 and FIG. 2D, step S108 is performed, and a charge trapping layer CT, a resistance switching layer RS and a first barrier layer BR1 are sequentially formed on the bottom electrodes BE. The charge trapping layer CT, the resistance switching layer RS and the first barrier layer BR1 blanketly cover the dielectric filling structures IL and the bottom electrodes BE. It should be noted that, for conciseness, only some portions of the charge trapping layer CR, the resistance switching layer RS and the first barrier layer BR1 are depicted in FIG. 2D through FIG. 2J. In some embodiments, a material of the charge trapping layer CT includes silicon nitride, silicon oxynitride or a combination thereof. In some embodiments, a method for forming the charge trapping layer CT includes initially forming a silicon-containing material layer (not shown), then performing a thermal treatment on the silicon-containing material layer in an environment filled with nitrogen gas, oxygen gas or a combination thereof, such that the silicon-containing material layer could react with the afore-mentioned gas to form silicon nitride, silicon oxynitride or a combination thereof. The charge trapping layer CT is electrically insulating, and is able to trap charges. In this way, crosstalk between the subsequently formed resistive memory cells MU (as shown in FIG. 2H) sharing the same bottom electrode BE may be reduced by parasitic capacitor effect or parasitic resistor effect. On the other hand, a material of the resistance switching layer RS may include $HfO_2$, $ZrO_2$, HfZrO, HfAlO, HfON, HfSiO, HfSrO, HfYO, the like or combinations thereof, and a method for forming the resistance switching layer RS may include a PVD process, a CVD process or an atomic layer deposition (ALD) process. In addition, a material of the first barrier layer BR1 may be metal oxide (e.g., aluminum oxide) or nitride (e.g., silicon nitride). In some embodiments, a thickness of the charge trapping layer CT may range from 0.4 nm to 4 nm, a thickness of the resistance switching layer RS may range from 3 nm to 30 nm, and a thickness of the first barrier layer BR1 may range from 0.4 nm to 4 nm.

Figure 2E:
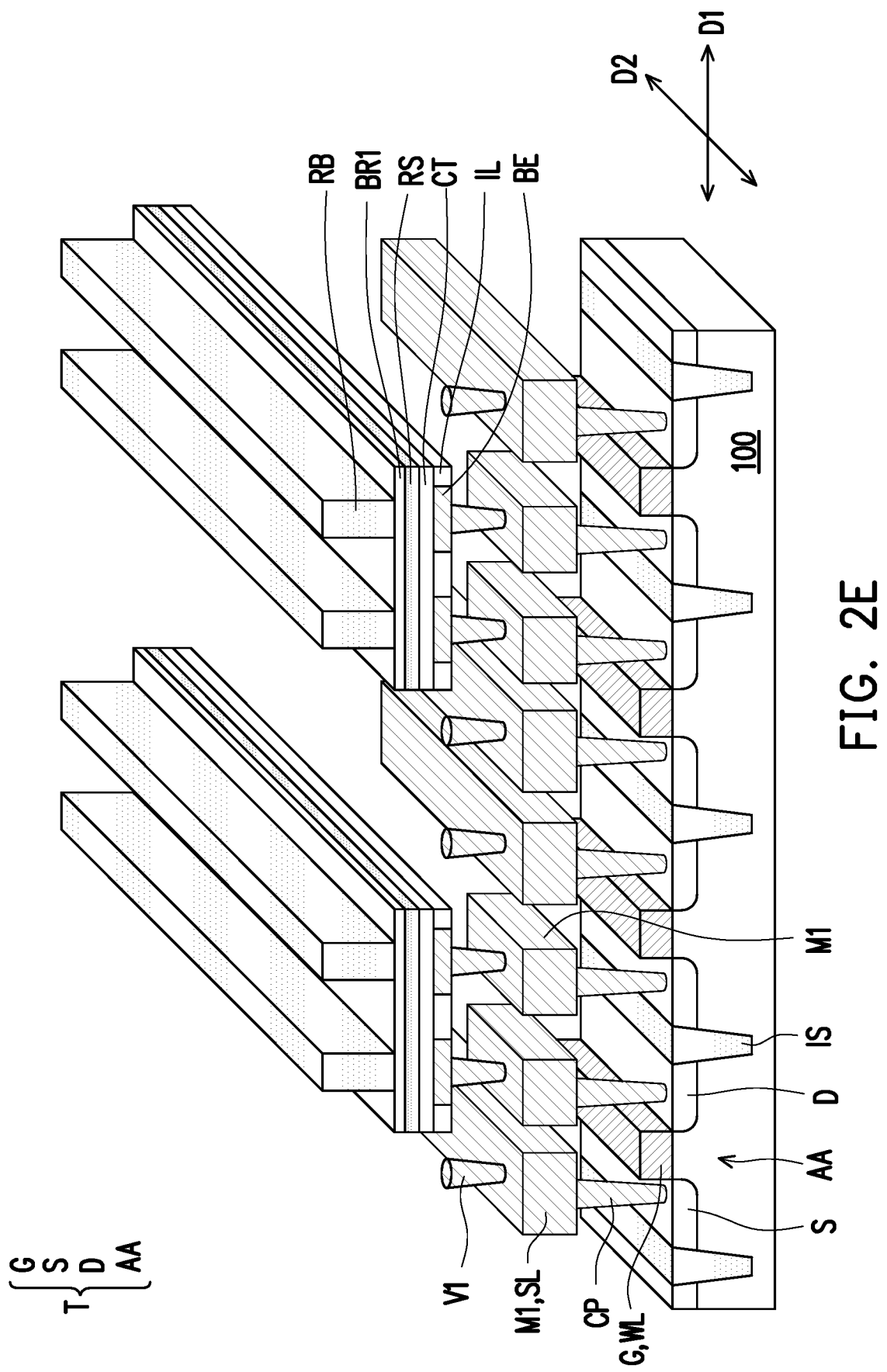

Referring to FIG. 1 and FIG. 2E, step S110 is performed, and laterally separated insulating patterns RB are formed on the first barrier layer BR1. The insulating patterns RB are arranged along the first direction D1, and extend along the second direction D2. Each of the insulating patterns RB may be overlapped with one of the underlying bottom electrodes BE. In some embodiments, a width of the insulating pattern RB is less than a width of the bottom electrode BE. For instance, a ratio of the thickness of the insulating pattern RB with respect to the width of the bottom electrode BE may range from 0.1 to 0.5. On the other hand, a length of the insulating pattern RB is substantially equal to a length of the bottom electrode BE. In addition, a height of the insulating pattern RB may define a channel length of the subsequently formed resistive memory cell MU (as shown in FIG. 2H), and this channel length may be greater than the thickness of the resistance switching layer RS. For instance, the height of the insulating pattern RB may range from 10 nm to 150 nm, and the thickness of the resistance switching layer RS may range from 3 nm to 30 nm. In some embodiments, a method for forming the insulating patterns RB includes forming an insulating material layer blanketly covering the first barrier layer BR1, then patterning this insulating material layer to form the insulating patterns RB. The afore-mentioned insulating material layer for forming the insulating patterns RB may be made of silicon oxide, silicon nitride, the like or combinations thereof, and may be formed by, for example, a CVD process.

Figure 2F:
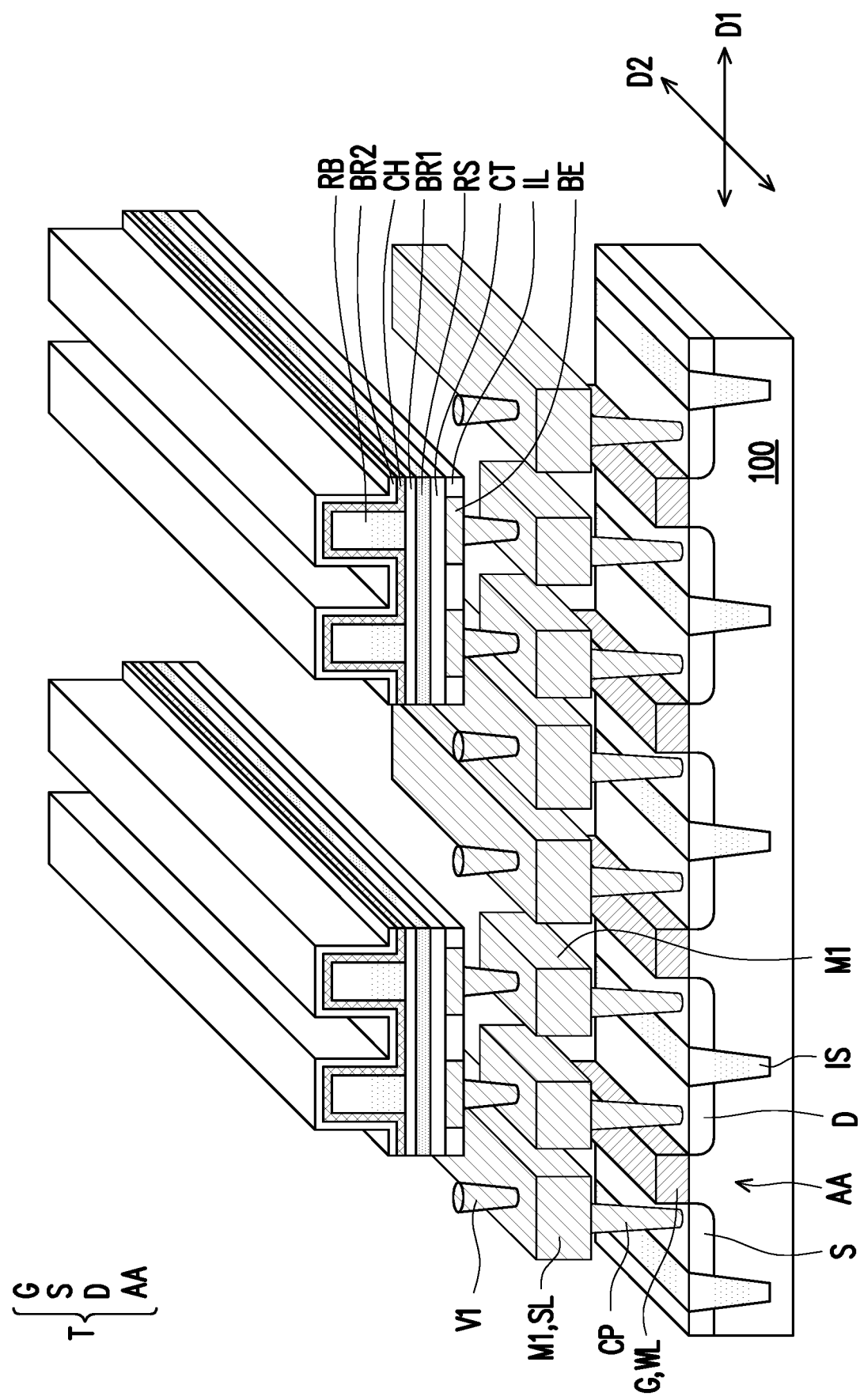

Referring to FIG. 1 and FIG. 2F, step S112 is performed, and a channel layer CH and a second barrier layer BR2 are sequentially formed on the insulating patterns RB. It should be noted that, for conciseness, the channel layer CH and the second barrier layer BR2 are partially depicted in FIG. 2G through FIG. 2J. In some embodiments, the channel layer CH and the second barrier layer BR2 are blanketly and conformally formed on the first barrier layer BR1 and the insulating patterns RB. In this way, the channel layer CH and the second barrier layer BR2 may respectively have horizontally extending portions and vertically extending portions. The horizontally extending portions extend along a top surface of the first barrier layer B1 and top surfaces of the insulating patterns RB, whereas the vertically extending portions extend along sidewalls of the insulating patterns RB. The vertically extending portions of the channel layer CH may be functioned as channel regions of the subsequently formed resistive memory cells MU (as shown in FIG. 2H). In addition, a thickness of the channel layer CH may define a channel width of the resistive memory cells MU, and this channel width is less than a width of each insulating pattern RB (a dimension of each insulating pattern RB along the first direction DD. For instance, the thickness of the channel layer CH may range from 10 nm to 60 nm. Furthermore, a ratio of the thickness of the channel layer CH (i.e., the channel width) with respect to the thickness of the insulating pattern RB (i.e., the channel length) may range from 0.05 to 0.35. In some embodiments, a material of the channel layer CH may include a metal material, such as Ti, Al, the like or combinations thereof, and a method for forming the channel layer CH includes a PVD process. Moreover, in some embodiments, a material of the second barrier layer BR2 may be metal oxide (e.g., aluminum oxide) or nitride (e.g., silicon nitride). In addition, a thickness of the second barrier layer BR2 may range from 0.4 nm to 4 nm.

Figure 2G:
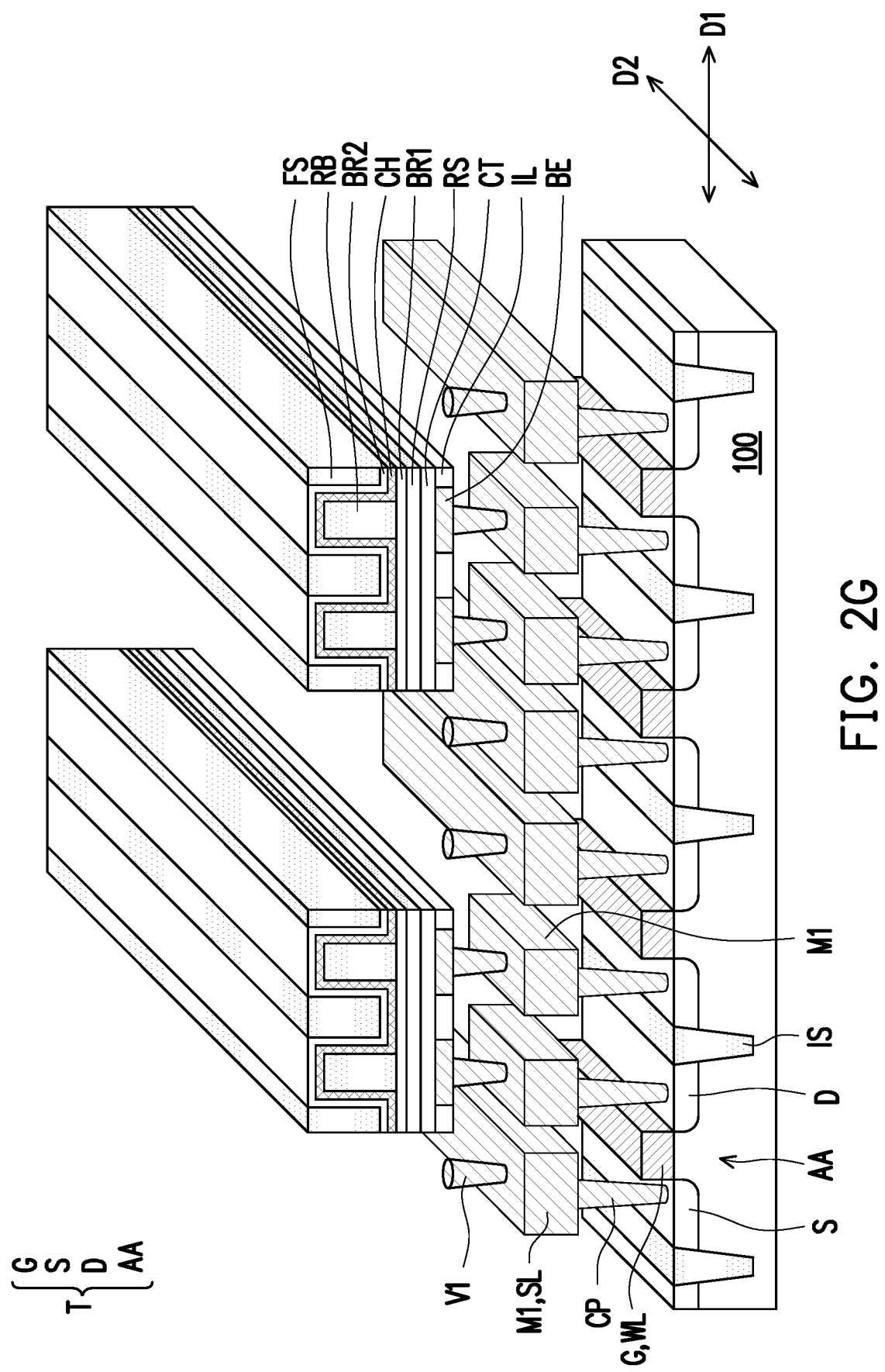
Figure 2H:
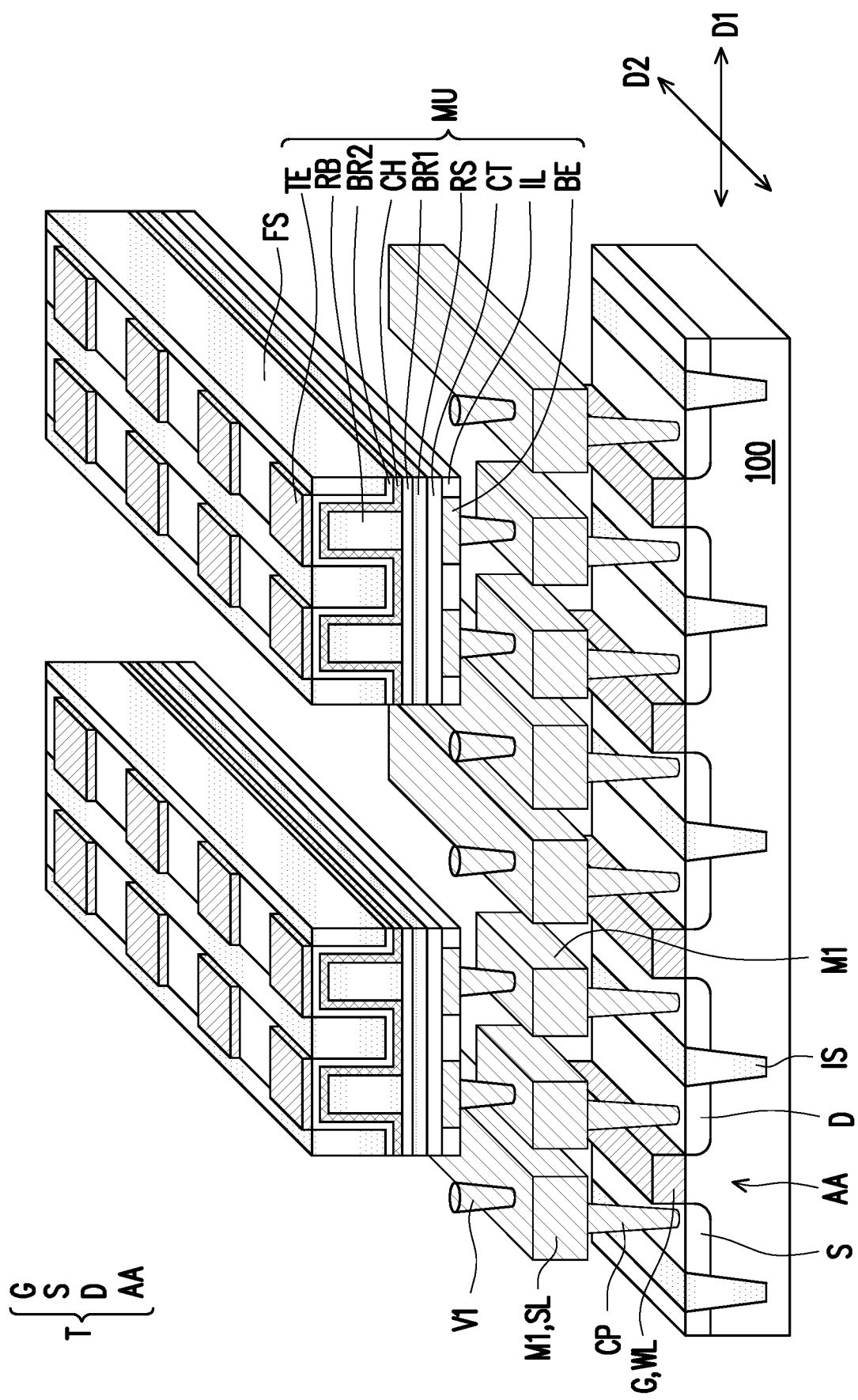

Referring to FIG. 1 and FIG. 2G, step S114 is performed, and multiple dielectric filling structures FS are formed on the current structure. It should be noted that, for conciseness, only some of the dielectric filling structures FS are depicted in FIG. 2J. The dielectric filling structures FS are respectively filled in a recess defined between adjacent insulating patterns RB, and cover portions of the channel layer CH and the second barrier layer BR2 between the insulating patterns RB. A material of the dielectric filling structures FS may be an insulating material, such as silicon oxide, silicon nitride, the like or combinations thereof. In some embodiments, a method for forming the dielectric filling structures FS includes forming an insulating material layer blanketly covering the structure shown in FIG. 2F by a deposition process (e.g., a CVD process), then removing portions of this insulating material layer above the insulating patterns RB by a planarization process (e.g., a CMP process, an etching process or a combination thereof), so as to expose topmost surfaces of the second barrier layer BR2 and to form the dielectric insulating structures FS. In some embodiments, top surfaces of the dielectric filling structures FS may be substantially coplanar with the topmost surfaces of the second barrier layer BR2.

Referring to FIG. 1 and FIG. 2H, step S116 is performed, and separated top electrodes TE are formed over the topmost surfaces of the second barrier layer BR2. The top electrodes TE are arranged along the first direction D1 and the second direction D2. The top electrodes TE arranged along the second direction D2 in the same column are overlapped with one of the insulating patterns RB and one of the bottom electrodes BE, and are overlapped with some portions of the second barrier layer BR2, the channel layer CH, the first barrier layer BR1, the resistance switching layer RS and the charge trapping layer CT. In addition, as shown in the current structure, some portions of the second barrier layer BR2 are exposed between the top electrodes TE arranged in each column of the top electrodes TE, and the dielectric filling structures FS are exposed between columns of the top electrodes TE. In some embodiments, a method for forming the top electrodes TE includes initially forming an electrode material layer blanketly covering the structure shown in FIG. 2G, then patterning this electrode material layer to form the top electrodes TE. For instance, the electrode material layer for forming the top electrodes TE may be made of a metal material, and this metal material is different from the metal material for forming the channel layer CH. For instance, the metal material for forming the top electrodes TE may include W, Pt, Al, Ti, TiN, the like or combinations thereof, and a method for forming this electrode material layer may include a deposition process (e.g., a PVD process), a plating process (e.g., an electroplating process or an electroless plating process) or a combination thereof.

In some embodiments, a resistive memory cell MU includes one of the top electrodes TE along with portions of the underlying second barrier layer BR2, channel layer CH, insulating pattern RB, first barrier layer BR1, resistance switching layer RS, charge trapping layer CT and bottom electrode BE overlapped with this top electrode TE. In the resistive memory cell MU according to the present embodiment, two vertically extending portions of the channel layer CH at opposite sides of the insulating pattern BR may be functioned as channel regions. As such, the resistive memory cell MU can be referred as a bi-channel resistive memory cell MU. In regarding all of the resistive memory cells MU, the bottom electrodes BE of the resistive memory cells MU arranged along the first direction D1 are electrically isolated from each other by the dielectric filling structures IL. On the other hand, the resistive memory cells MU arranged along the second direction D2 in the same column share the same bottom electrode BE. Nevertheless, the charge trapping layer CT can reduce crosstalk between the resistive memory cells MU in the same column. In some embodiments, each bottom electrode BE is electrically connected with one of the transistors T. In these embodiments, the resistive memory cells MU arranged along the second direction D2 in the same column may be controlled by a single transistor T. In addition, the resistive memory cells MU arranged along the second direction D2 in the same column have separated top electrodes TE.

Figure 2I:
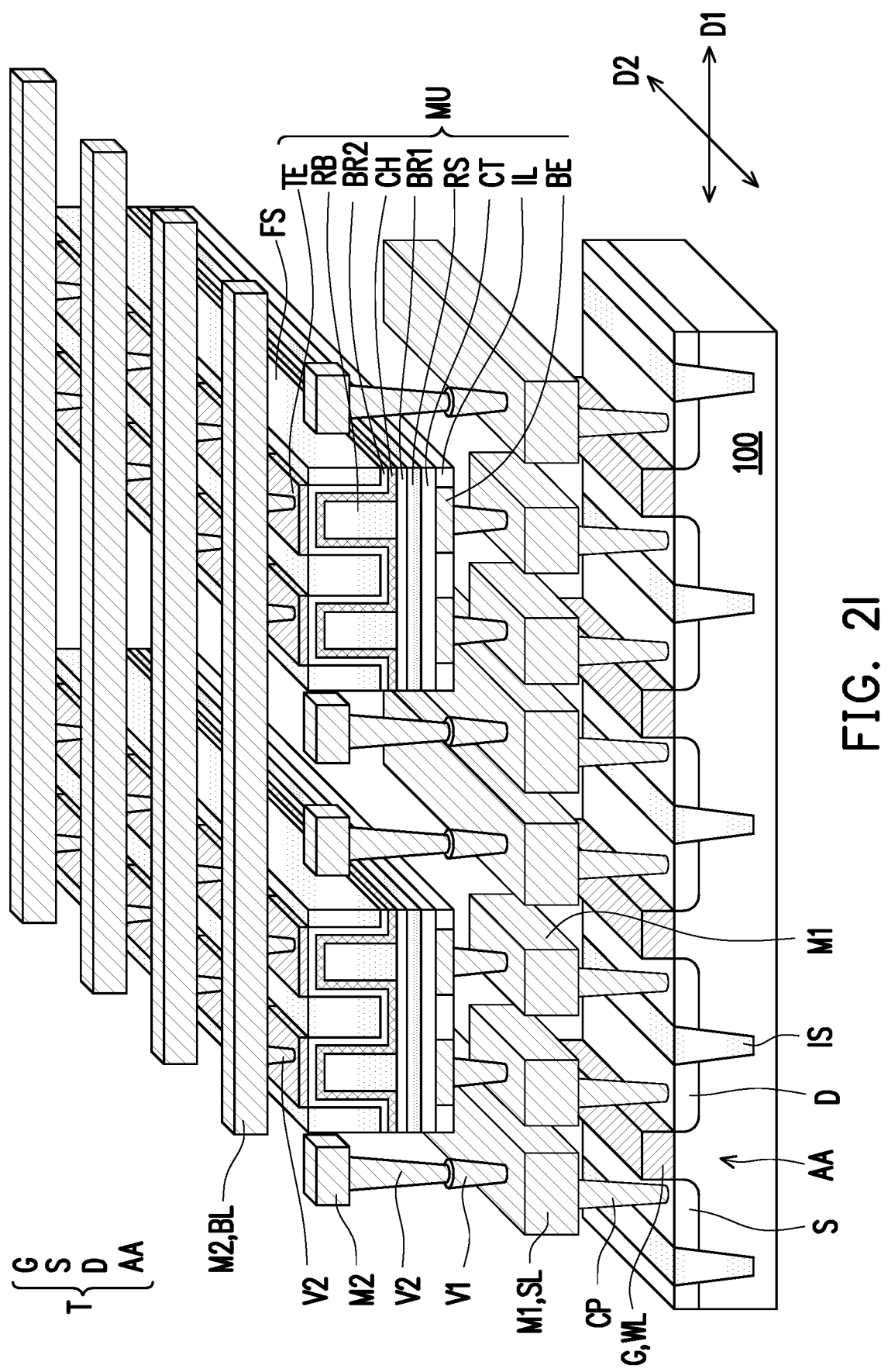
Figure 2J:
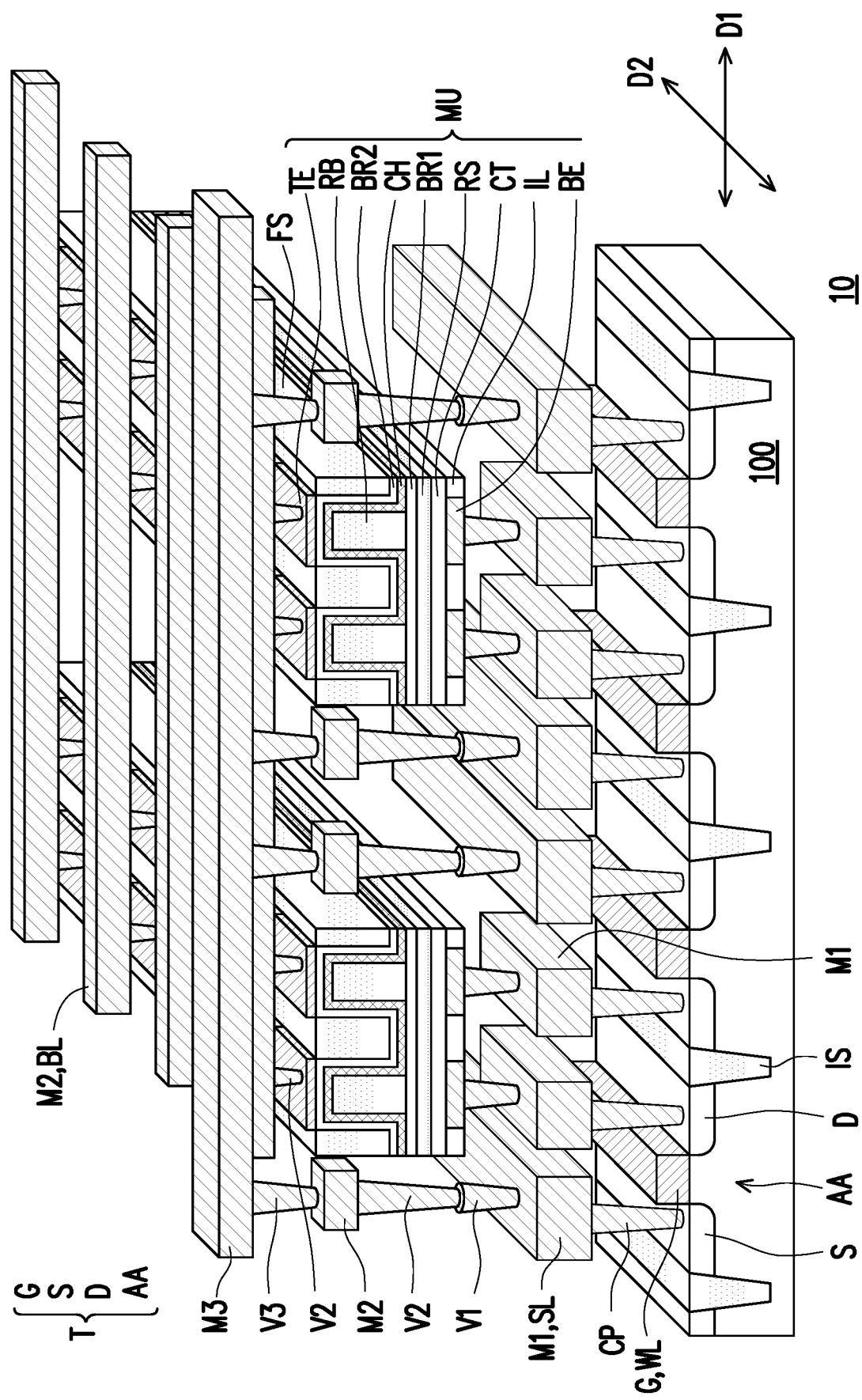

Referring to FIG. 1 and FIG. 2I, step S118 is performed, and multiple second conductive vias V2 and multiple second metal patterns M2 are formed. A third interlayer dielectric layer (not shown) may be formed on the structure shown in FIG. 2H before formation of the second conductive vias V2 and the second metal patterns M2. The third interlayer dielectric layer may blanketly cover the dielectric filling structures FS, the top electrodes TE and the exposed portions of the second barrier layer BR2. Thereafter, multiple through vias are formed in the third interlayer dielectric layer. Some of the through vias extend to the top electrodes TE, and others of the through vias further extend to some of the first conductive vias V1 through some of the dielectric filling structures FS. Subsequently, a conductive material is filled into these through vias, so as to form the second conductive vias V2. In this way, some of the second conductive vias V2 are electrically connected to the top electrodes TE, and others of the second conductive vias V2 are electrically connected to some of the first metal patterns M1 through some of the first conductive vias V1. In some embodiments, after formation of the second conductive vias V2, a fourth interlayer dielectric layer (not shown) and the second metal patterns M2 may be formed on the third interlayer dielectric layer (not shown) and the second conductive vias V2 by a method similar to the method for forming the first metal patterns M1. Some of the second metal patterns M2 are respectively in electrical contact with the top electrodes TE arranged in the same row through some of the second conductive vias V2, and extend along the first direction D1 as bit lines BL. On the other hand, some other second metal patterns M2 are electrically connected to the source lines SL through some of the second conductive vias V2 and some of the first conductive vias V1.

In alternative embodiments, the third interlayer dielectric layer (not shown), the fourth interlayer dielectric layer (not shown), the second conductive vias V2 and the second metal patterns M2 may be otherwise formed by a dual damascene process. The present disclosure is not limited to sequential order of the above-described steps.

Referring to FIG. 1 and FIG. 2J, step S120 is performed, and multiple third conductive vias V3 and multiple third metal patterns M3 are formed. In some embodiments, the third conductive vias V3 and the third metal patterns M3 are formed by a method similar to the method for forming the second conductive vias V2 and the second metal patterns M2. The third conductive vias V3 are electrically connected to the source lines SL through some of the second metal patterns M2, some of the second conductive vias V2 and some of the first conductive vias V1. Each third metal pattern M3 is electrically connected to the third conductive vias V3 in the same row, and extends along the first direction D 1. In some embodiments, the third metal pattern M3 may be functioned as a common source line.

Figure 3:
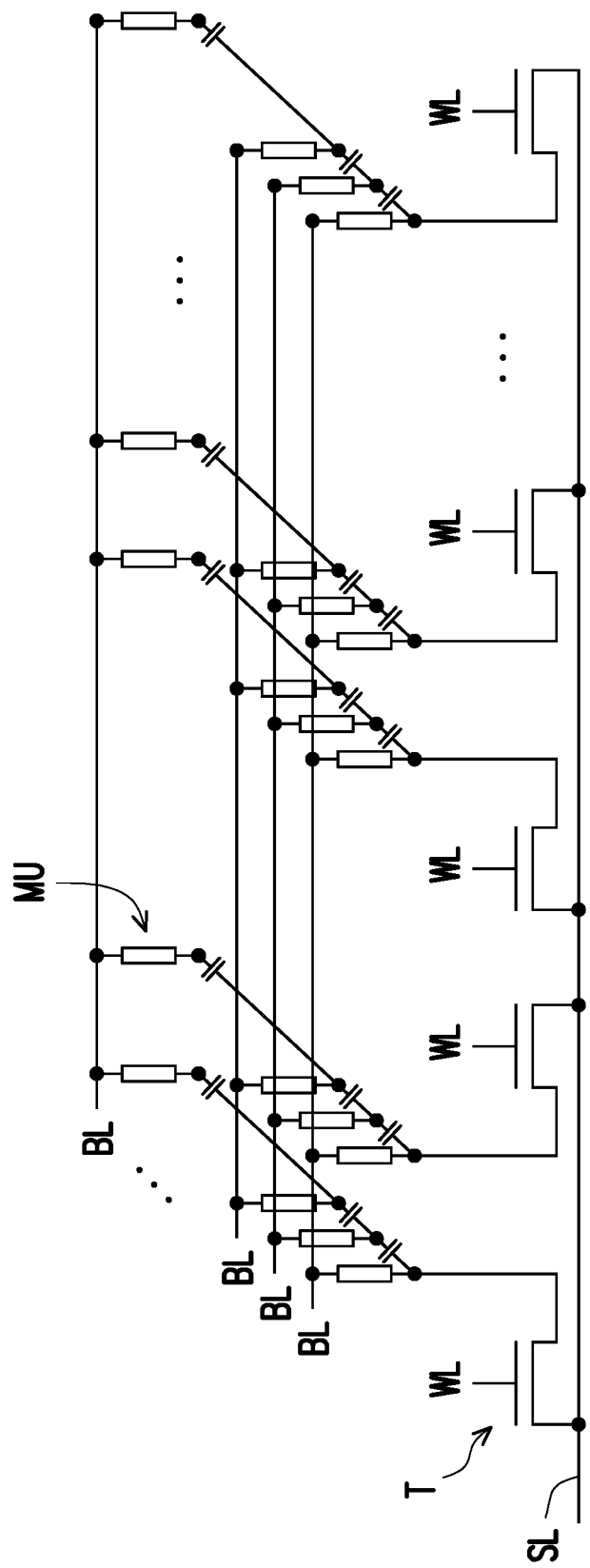
FIG. 3 exemplarily illustrates an equivalent circuit of the RRAM device as shown in FIG. 2J.

Up to here, the RRAM device 10 has been formed. FIG. 3 exemplarily illustrates an equivalent circuit of the RRAM device 10 as shown in FIG. 2J. As shown in FIG. 3, the resistive memory cells MU in the same column can be controlled by a single transistor T, and these resistive memory cells MU in the same column are respectively connected to one of the bit lines BL. In addition, equivalent capacitors between adjacent resistive memory cells MU are depicted in FIG. 3, so as to illustrate the suppression on the crosstalk between adjacent resistive memory cells MU by the charge trapping layers CT described with reference to FIG. 2J. It should be noted that, only a block of the RRAM device 10 is depicted in FIG. 2J and FIG. 3. The RRAM device 10 may actually have more blocks, and each of the blocks may have more (or less) of the transistors T and the resistive memory cells MU.

Referring to FIG. 2J, the RRAM device 10 includes a plurality of the resistive memory cells MU. Each resistive memory cell MU includes one of the top electrodes TE, and includes portions of the resistance switching layer RS, the insulating pattern RB, the channel layer CH and the bottom electrode BE that are overlapped with this top electrode TE. The insulating pattern RB is disposed on the resistance switching layer RS, and two vertically extending portions of the channel layer CH covering sidewalls of the insulating pattern RB may be functioned as two channel regions of the resistive memory cell MU. Therefore, the resistive memory cell MU can be a bi-channel resistive memory cell. If one of the channel regions of the resistive memory cell MU is failed as a result of soft errors, another channel region of the resistive memory cell MU can still maintain functional. Accordingly, as compared to a resistive memory cell having a single channel region, the bi-channel resistive memory cell MU according to embodiments of the present disclosure has an improved reliability. In addition, during fabrication of the resistive memory cells MU, patterning process is only required while forming the bottom electrodes BE, the insulating patterns RB and the top electrodes TE, and the formation of other components (e.g., the charge trapping layer CT, the resistance switching layer RS, the first barrier layer BR1, the channel layer CH and the second barrier layer BR2) may be free of patterning process. As such, the fabrication of the resistive memory cells MU can be simplified, and dimensions and profile of the resistive memory cells MU can be better controlled. Besides, problems came from the patterning process (e.g., problems caused by an etching step) can be further reduced. In some embodiments, the resistive memory cells MU in the same column share the same bottom electrode BE, and the charge trapping layer CT disposed between the bottom electrodes BE and the resistance switching layer RS may suppress the crosstalk between the resistive memory cells MU sharing the same bottom electrode BE.

Figure 4:
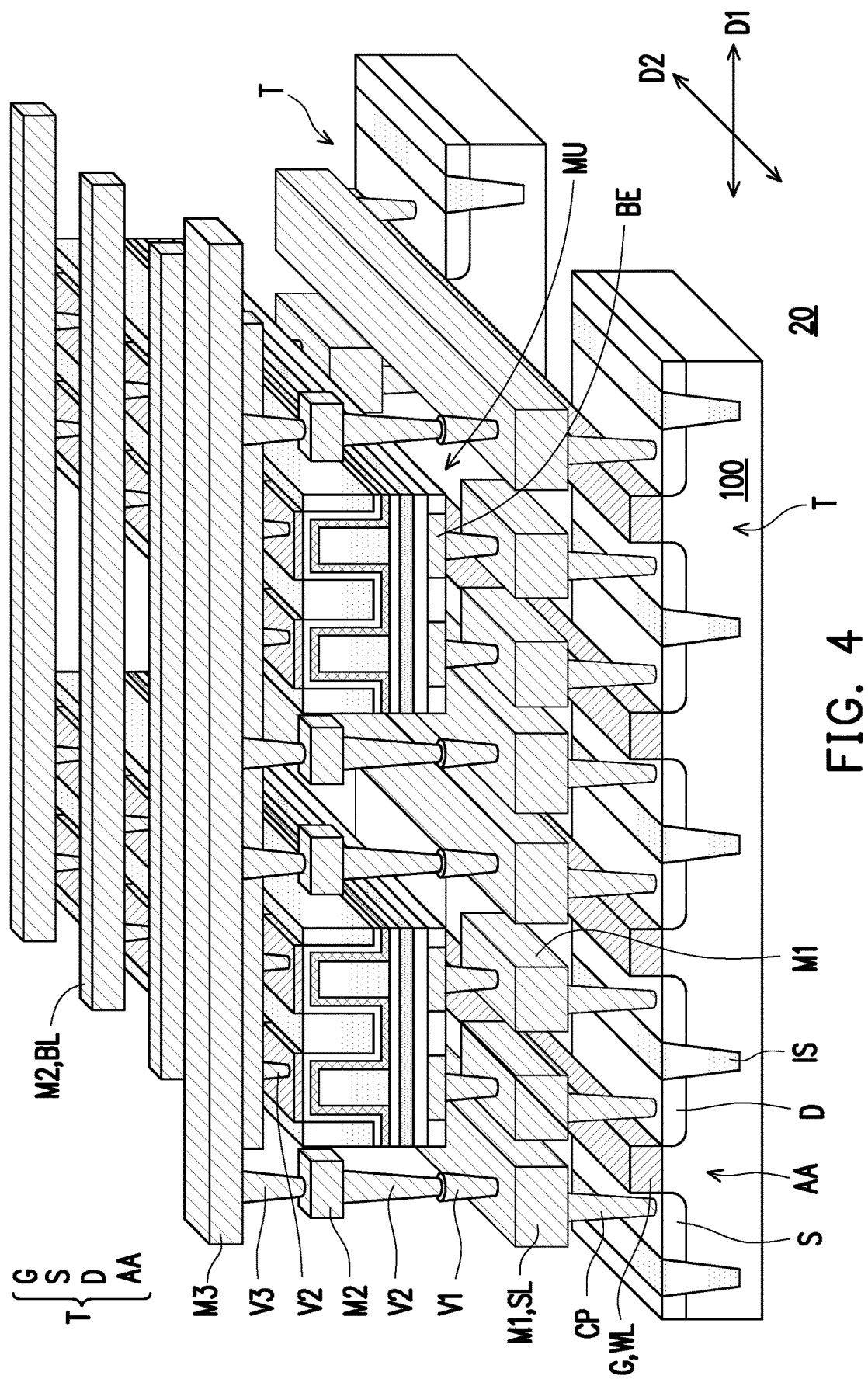
FIG. 4 is schematic three-dimensional view illustrating a RRAM device according to some embodiments of the present disclosure.

FIG. 4 is schematic three-dimensional view illustrating a RRAM device 20 according to some embodiments of the present disclosure. The RRAM device 20 shown in FIG. 4 is similar to the RRAM device 10 as shown in FIG. 2J. Only difference therebetween will be described, the same or the like parts would not be repeated again.

Referring to FIG. 4, each block of the RRAM device 20 includes transistors T arranged as multiple rows (e.g., 2 rows). In this way, the transistors T may be arranged as an array having multiple rows and multiple columns. The transistors T arranged along the second direction D2 in the same column may share the same word line WL. In addition, the transistors T arranged along the second direction D2 in the same column may be electrically to the same bottom electrode BE, and may be configured to control the resistive memory cells MU arranged along the second direction D2 in the same column. Even though only 2 rows of the transistors T are illustrated in the RRAM device 20 shown in FIG. 3, those skilled in the art may dispose 3 or more rows of the transistors T in each block of the RRAM device 20 according to design requirements, the present disclosure is not limited to the amount of rows or columns of the transistors T in each block.

FIG. 5A through FIG. 5D are schematic three-dimensional views illustrating structures at several stages during a manufacturing process of a RRAM device according to some other embodiments of the present disclosure.

Figure 5A:
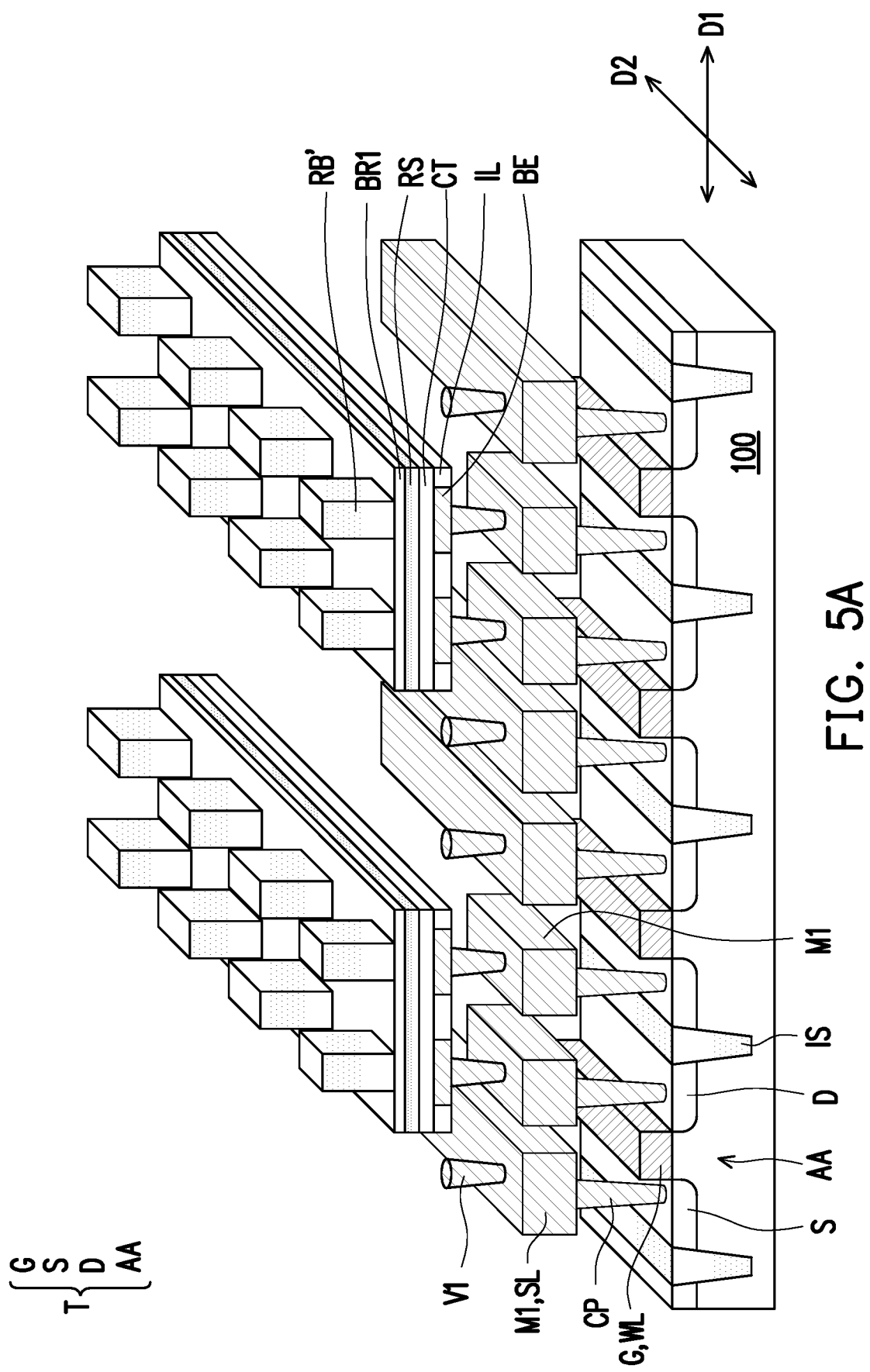
FIG. 5A through FIG. 5D are schematic three-dimensional views illustrating structures at several stages during a manufacturing process of a RRAM device according to some other embodiments of the present disclosure.

Referring to FIG. 5A, after step S100 through step S108 (as described with reference to FIG. 2A through FIG. 2D) have been performed, step S110 is performed, and separated insulating patterns RB' are formed on the first barrier layer BR1. According to the present embodiment, the insulating patterns RB' are separated from one another along both of the first direction D1 and the second direction D2. In other words, the insulating patterns RB' are arranged along the first direction D1 and the second direction D2, and are separated from one another.

Figure 5B:
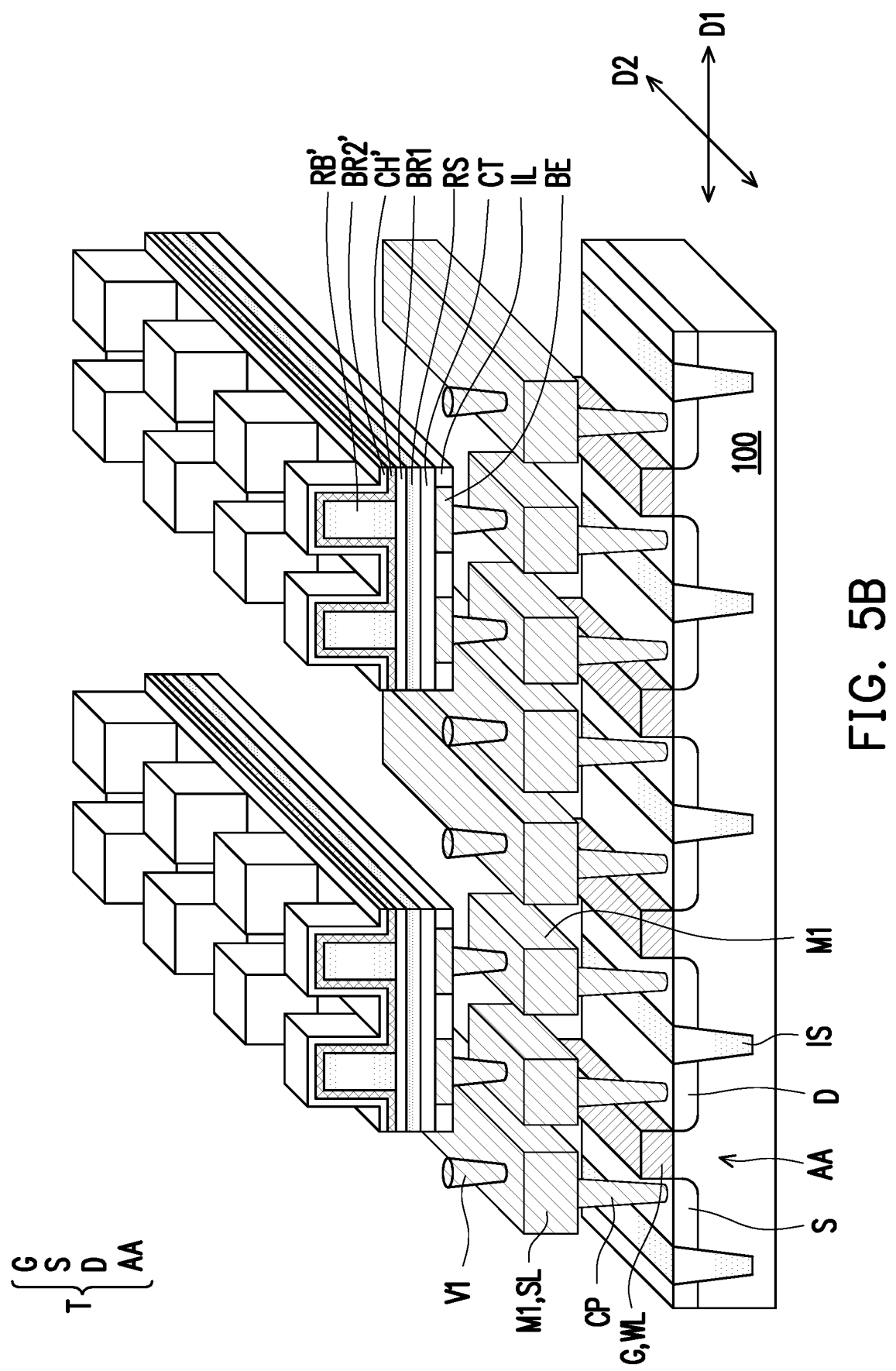

Referring to FIG. 5B, step S112 is subsequently performed, and a channel layer CH' and a second barrier layer BR2' are sequentially formed on the insulating patterns RB'. The channel layer CH' and the second barrier layer BR2' blanketly and conformally cover the insulating patterns RB'. In those embodiments where the insulating patterns RB' are cuboid or cubic, the channel layer CH' covers four sidewalls of each insulating pattern RB', and may have four channel regions. In this way, the subsequently formed resistive memory cells MU' may respectively be a quad-channel resistive memory cell.

Figure 5C:
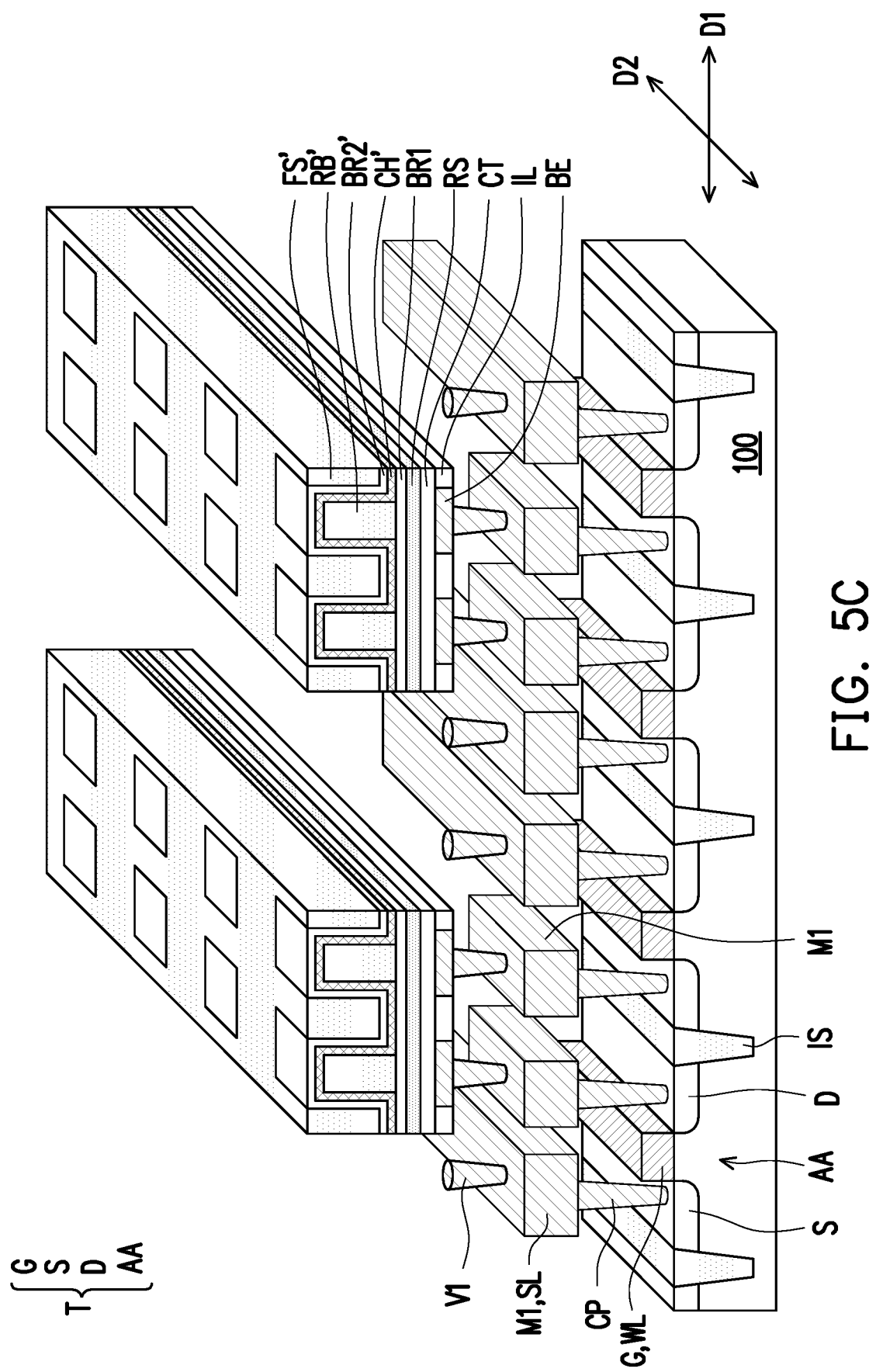

Referring to FIG. 5C, step S114 is then performed, and a dielectric filling structure FS' is formed on the current structure. Since the insulating patterns RB' are separated from one another along both of the first direction D1 and the second direction D2, the dielectric filling structure FS' filled between the insulating patterns RB' continuously extends along the first direction D1 and the second direction D2, and may be regarded as a single structure.

Figure 5D:
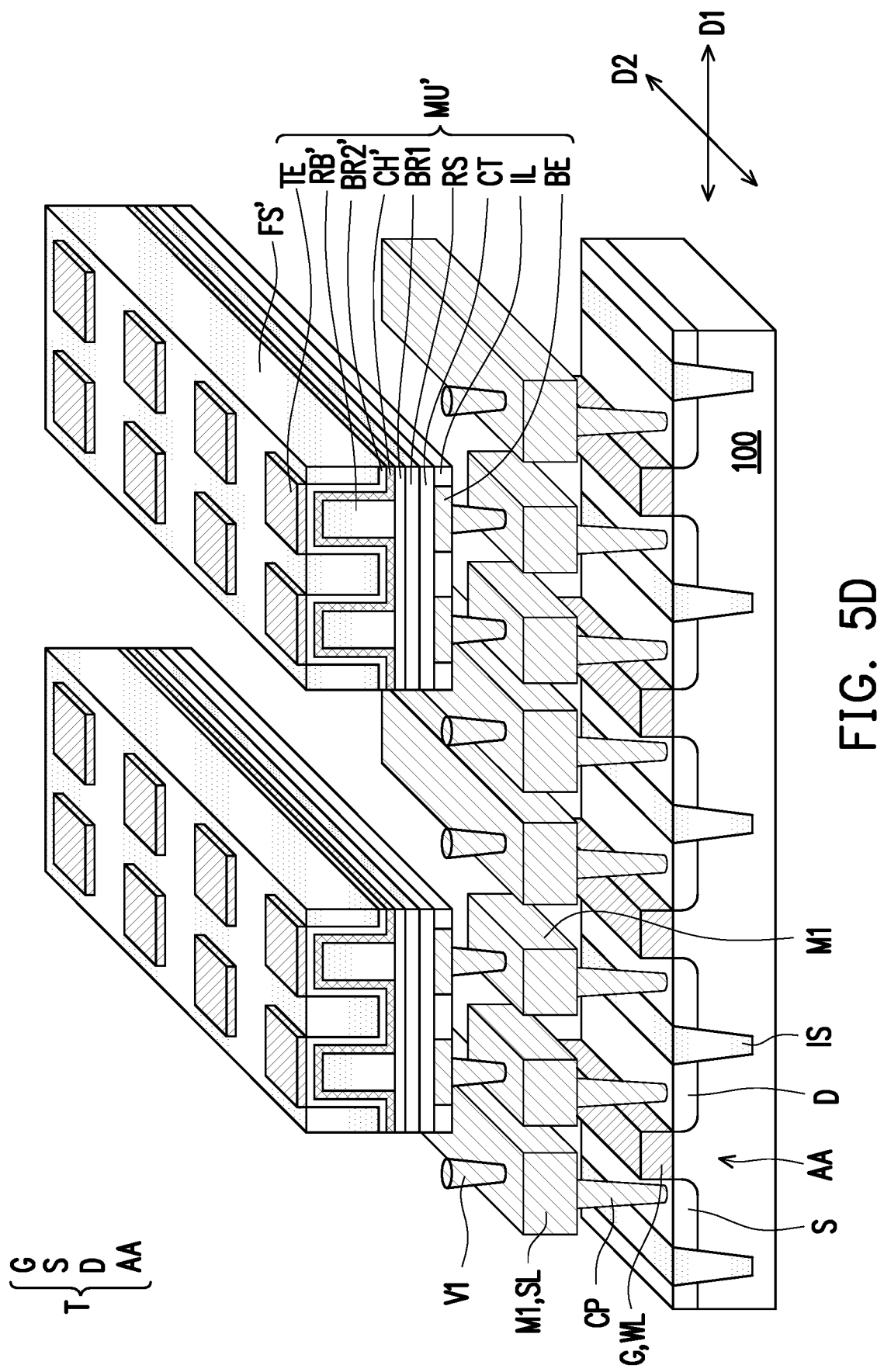

Referring to FIG. 5D, step S116 is performed, and separated top electrodes TE are formed on topmost surfaces of the second barrier layer BR2'. The top electrodes TE are overlapped with the insulating patterns RB', respectively. A resistive memory cell MU' includes one top electrode TE along with some portions of the underlying second barrier layer BR2', channel layer CH', first barrier layer BR1, resistance switching layer RS, charge trapping layer CT and bottom electrode BE. As described above, in some embodiments, the resistive memory cell MU' has four channel regions, and may be regarded as a quad-channel resistive memory cell. Thereafter, step S118 and step S120 as described with reference to FIG. 2I and FIG. 2J may be performed, so as to form the RRAM device according to the present embodiment.

As above, the resistive memory cell according to embodiments of the present disclosure includes one of the top electrodes, and includes portions of the resistance switching layer, the insulating pattern, the channel layer and the bottom electrode that are overlapped with this top electrode. The insulating pattern is disposed on the resistance switching layer, and multiple vertically extending portions of the channel layer covering sidewalls of the insulating pattern may be functioned as channel regions of the resistive memory cell. Therefore, the resistive memory cell can be a multi-channel resistive memory cell. If one of the channel regions of the resistive memory cell is failed as a result of soft errors, other channel region(s) of the resistive memory cell can still be functional. Accordingly, as compared to a resistive memory cell having a single channel region, the multi-channel resistive memory cell according to embodiments of the present disclosure has an improved reliability. In addition, during fabrication of the resistive memory cells, patterning process is only required while forming the bottom electrodes, the insulating patterns and the top electrodes, and the formation of other components (e.g., the charge trapping layer, the resistance switching layer, the first barrier layer, the channel layer and the second barrier layer) may be free of patterning process. As such, the fabrication of the resistive memory cells can be simplified, and dimensions and profile of the resistive memory cells can be better controlled. In some embodiments, the resistive memory cells in the same column share the same bottom electrode, and the charge trapping layer disposed between the bottom electrodes and the resistance switching layer may suppress the crosstalk between the resistive memory cells sharing the same bottom electrode.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a RRAM device, comprising:
   forming bottom electrodes, wherein the bottom electrodes are arranged along a first direction and extending along a second direction;
   blanketly forming a resistance switching layer on the bottom electrodes;
   forming a first insulating material layer on the resistance switching layer;
   patterning the first insulating material layer to form insulating patterns, wherein each of the insulating patterns is overlapped with one of the bottom electrodes;
   conformally forming a channel layer on the resistance switching layer and the insulating patterns, wherein the channel layer has a plurality of channel regions, the plurality of channel regions are located on the resistance switching layer, and cover opposite sides of the insulating patterns;

forming a second electrode material layer on the channel layer; and patterning the second electrode material layer to form top electrodes, each of the top electrodes is located in corresponding to one of the insulating patterns and covers at least two of the plurality of channel regions, such that the at least two of the channel regions are located between one of the bottom electrodes and one of the top electrodes.

2. The manufacturing method of the RRAM device according to claim 1, further comprising:

blanketly forming a charge trapping layer on the bottom electrodes after the formation of the bottom electrodes and before the formation of the resistance switching layer, wherein a material of the charge trapping layer comprises silicon oxide, silicon oxynitride, silicon nitride or combinations thereof.

3. The manufacturing method of the RRAM device according to claim 1, further comprising: blanketly forming a first barrier layer on the resistance switching layer after the formation of the resistance switching layer and before the formation of the insulating patterns.

4. The manufacturing method of the RRAM device according to claim 1, further comprising:

conformally forming a second barrier layer after the formation of the channel layer and before the formation of the second electrode material layer, wherein the second barrier layer is located between the channel layer and the top electrodes; and forming a second insulating material layer on the channel layer and removing portions of the second insulating material layer above the insulating patterns to form second dielectric filling structures filling between the insulating patterns, wherein the formation of the second insulating layer and the patterning of the second insulating layer are performed after the formation of the channel layer and before the formation of the second electrode material layer.

5. The manufacturing method of the RRAM device according to claim 4, wherein each of the plurality of channel regions is located between one of the insulating patterns and one of the second dielectric filling structures, and a surface of the second barrier layer is coplanar with surfaces of the second dielectric filling structures.

6. The manufacturing method of the RRAM device according to claim 1, further comprising: forming first dielectric filling structures before the formation of the resistance switching layer, wherein the first dielectric filling structures are disposed between the bottom electrodes.

7. The manufacturing method of the RRAM device according to claim 6, wherein surfaces of the first dielectric filling structures are coplanar with surfaces of the bottom electrodes.

8. The manufacturing method of the RRAM device according to claim 1, further comprising: forming multiple transistors in and over a substrate before the formation of the bottom electrodes.

9. The manufacturing method of the RRAM device according to claim 8, further comprising: forming multiple conductive plugs on the multiple transistors before the formation of the bottom electrodes, wherein the multiple conductive plugs are electrically connected to the multiple transistors, respectively.

10. The manufacturing method of the RRAM device according to claim 9, further comprising: forming multiple metal patterns and multiple conductive vias on the multiple conductive plugs before the formation of the bottom electrodes, wherein the multiple metal patterns are electrically connected to the conductive plugs through the multiple conductive vias, respectively.

11. The manufacturing method of the RRAM device according to claim 10, wherein the bottom electrodes are electrically connected to the multiple transistors through the multiple metal patterns, multiple conductive vias, and multiple conductive plugs.

12. The manufacturing method of the RRAM device according to claim 1, wherein a length of each of the plurality of channel regions is greater than a thickness of the resistance switching layer.

13. The manufacturing method of the RRAM device according to claim 12, wherein a width of each of the plurality of channel regions is less than a width of each of the insulating patterns.

14. The manufacturing method of the RRAM device according to claim 1, wherein a ratio of a width of each of the plurality of channel regions with respect to a width of each of the insulating patterns range from 0.05 to 0.35.

15. The manufacturing method of the RRAM device according to claim 1, wherein a material of the channel layer comprises a metal material, and the metal material of the channel layer is different from a material of the top electrodes.

16. The manufacturing method of the RRAM device according to claim 15, wherein the channel layer comprises Al or Ti.

17. The manufacturing method of the RRAM device according to claim 15, wherein the material for forming the top electrodes includes W, Pt, Al, Ti, TiN, or a combinations thereof.

18. The manufacturing method of the RRAM device according to claim 1, wherein the insulating patterns are arranged along the first direction and extending along the second direction, and the top electrodes are separated from one another along the second direction.

19. The manufacturing method of the RRAM device according to claim 1, wherein the insulating patterns and the top electrodes are both separated from one another along the second direction.

20. The manufacturing method of the RRAM device according to claim 1, wherein a material of the bottom electrodes includes Ti, TiN, W, Pt, Al or a combination thereof.

* * * * *